US009048846B2

(12) United States Patent
Menkhoff et al.

(10) Patent No.: US 9,048,846 B2
(45) Date of Patent: Jun. 2, 2015

(54) DEVICE HAVING DIGITALLY CONTROLLED OSCILLATOR

(75) Inventors: Andreas Menkhoff, Oberhaching (DE); Sdravko Boos, Munich (DE)

(73) Assignee: Intel Mobile Communications, Gmbh (DE)

( * ) Notice: Subject to any disclaimer, the term of this patent is extended or adjusted under 35 U.S.C. 154(b) by 233 days.

(21) Appl. No.: 13/295,293

(22) Filed: Nov. 14, 2011

(65) Prior Publication Data

US 2012/0119931 A1   May 17, 2012

Related U.S. Application Data

(63) Continuation-in-part of application No. 12/201,275, filed on Aug. 29, 2008, now Pat. No. 8,076,977.

(51) Int. Cl.
  *H03L 7/085* (2006.01)
  *H03L 7/089* (2006.01)
  *H03L 7/197* (2006.01)
  *H03L 7/099* (2006.01)

(52) U.S. Cl.
  CPC .............. *H03L 7/085* (2013.01); *H03L 7/1976* (2013.01); *H03L 7/0991* (2013.01)

(58) Field of Classification Search
  USPC .......... 331/1 A, 16, 17, 177 R; 375/375, 376; 327/105, 159
  See application file for complete search history.

(56) References Cited

U.S. PATENT DOCUMENTS

| 5,357,447 | A  | 10/1994 | Ichiyoshi |
| 6,446,103 | B2 | 9/2002  | Schollhorn |
| 6,954,114 | B2 | 10/2005 | Schoner |
| 7,425,874 | B2 | 9/2008  | Risbo et al. |
| 7,692,500 | B1 | 4/2010  | Koukab et al. |
| 2005/0278403 | A1 | 12/2005 | Miller |
| 2006/0145902 | A1 | 7/2006  | Tucholski |
| 2006/0250287 | A1 | 11/2006 | Menkhoff et al. |
| 2006/0290543 | A1 | 12/2006 | Ye |
| 2007/0030939 | A1 | 2/2007  | Gazsi |
| 2007/0247248 | A1 | 10/2007 | Kobayashi et al. |
| 2007/0285177 | A1 | 12/2007 | Werker |
| 2008/0232531 | A1 | 9/2008  | Feller |

(Continued)

FOREIGN PATENT DOCUMENTS

| DE | 198 29 289 C2      | 1/2000 |
| DE | 10 2005 018 858 A1 | 11/2006 |

OTHER PUBLICATIONS

Author: Timo Rahkonen, Harri Eksyma, Heikki Repo Title: A DDS Synthesizer with Time Domain Interpolator Date of Conference (Meeting Date): Sep. 5, 1999-Sep. 8, 1999 Publisher: IEEE Pertinent pp. 327-330.*

(Continued)

*Primary Examiner* — Arnold Kinkead
*Assistant Examiner* — Richard Tan
(74) *Attorney, Agent, or Firm* — Green, Howard & Mughal, LLP

(57) ABSTRACT

A device includes a digital-to-time converter and an interpolator having a data input and a data output coupled to the digital-to-time converter. The interpolator may be configured to receive a converter control signal at the data input and to provide an interpolated converter control signal at the data output. An interpolation rate of the interpolator may depend on the converter control signal.

19 Claims, 10 Drawing Sheets

(56) References Cited

U.S. PATENT DOCUMENTS

Figure 1:
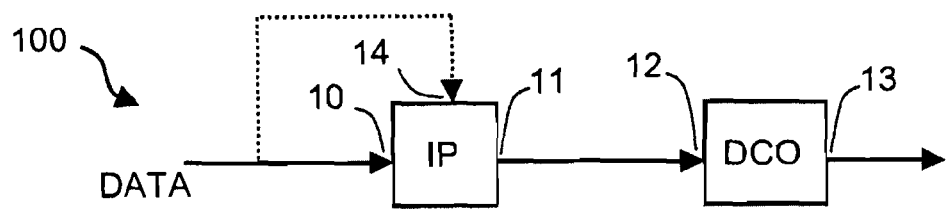

2008/0317188 A1    12/2008   Staszewski et al.
2009/0195906 A1    8/2009   Feller

OTHER PUBLICATIONS

Meyr, Heinrich, et al., "Digital Communication Receivers", Wiley Series in Telecommunications and Signal Processing, Chapter 9, pp. 505-532, 1998.

* cited by examiner

120# DEVICE HAVING DIGITALLY CONTROLLED OSCILLATOR

This application claims priority to, and is a continuation-in-part of, application Ser. No. 12/201,275, filed on Aug. 29, 2008, issued on Dec. 13, 2011 as U.S. Pat. No. 8,076,977, and hereby incorporated by reference as to its entirety.

BACKGROUND

Voltage controlled oscillators (VCO) are often being used in integrated circuits. VCOs may be substituted by digitally controlled oscillators (DCO). DCOs are controlled by feeding a control signal to the DCO. The control signal may contain a control word representative of a frequency at which the DCO should oscillate.

SUMMARY

This summary is provided to introduce a selection of illustrative concepts and aspects in a simplified form that are further described below in the Detailed Description, and is not intended to be limiting in any way.

According to an illustrative aspect, a device includes a digitally controlled oscillator and an interpolator having a data input and a data output coupled to the digitally controlled oscillator. The interpolator may be configured to receive an oscillator control signal at the data input and to provide an interpolated oscillator control signal at the data output. An interpolation rate of the interpolator may depend on the oscillator control signal.

According to another illustrative aspect, a device can include a digitally controlled oscillator having a control input, a sampling unit coupled to the control input of the digitally controlled oscillator, and a timing error detector coupled to an output of the digitally controlled oscillator. The sampling rate of the sampling unit can depend on an output of the timing error detector.

In a still further aspect, a method for controlling a digitally controlled oscillator is provided. The method may include generating an oscillator control signal at a first rate, feeding the oscillator control signal to a digitally controlled oscillator at a second rate, and operating a counter unit at an oscillation rate of the digitally controlled oscillator that is based on the oscillator control signal. Further, the method may include determining counter values of the counter unit at the first rate, and adjusting the second rate according to the counter values of the counter unit.

The various aspects summarized previously may be embodied in various forms. The following description shows by way of illustration of various combinations and configurations in which the aspects may be practiced. It is understood that the described aspects and/or embodiments are merely examples, and that other aspects and/or embodiments may be utilized and structural and functional modifications may be made, without departing from the scope of the present disclosure.

BRIEF DESCRIPTION OF THE SEVERAL VIEWS OF THE DRAWING(S)

Aspects of the invention are made more evident by way of example in the following detailed description of illustrative embodiments when read in conjunction with the attached drawing figures.

FIG. 1 schematically illustrates a device as one illustrative embodiment.

Figure 2:
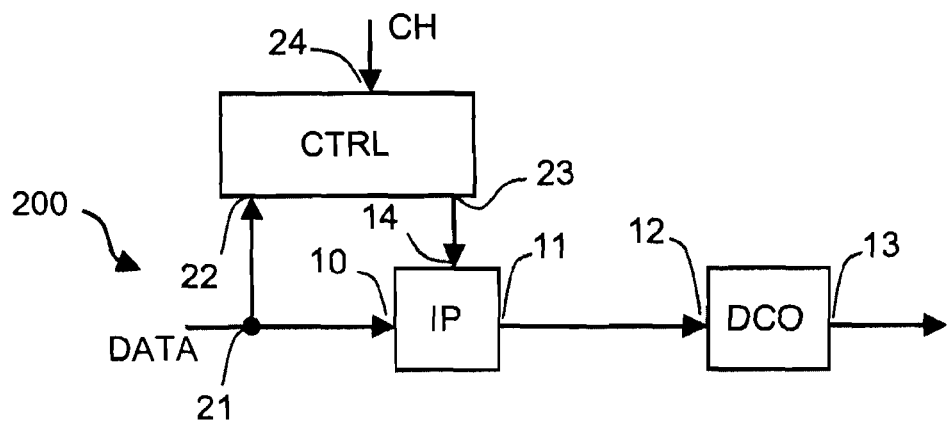

FIG. 2 schematically illustrates another device as one illustrative embodiment.

Figure 3:
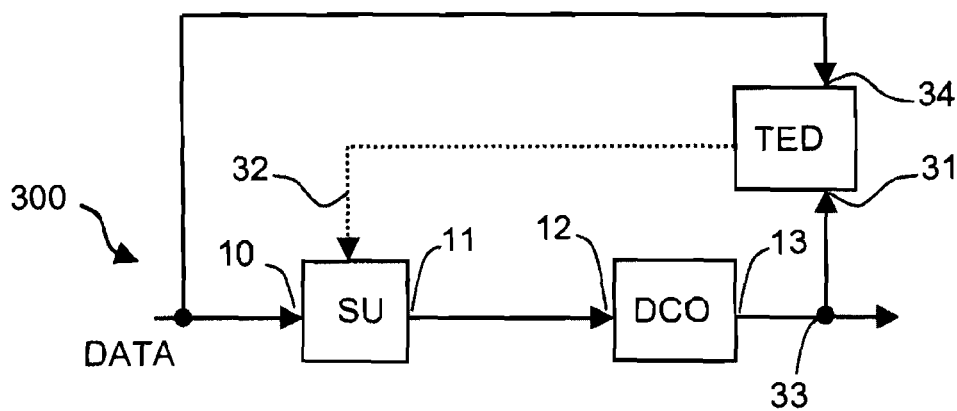

FIG. 3 schematically illustrates yet another device as one illustrative embodiment.

Figure 4:
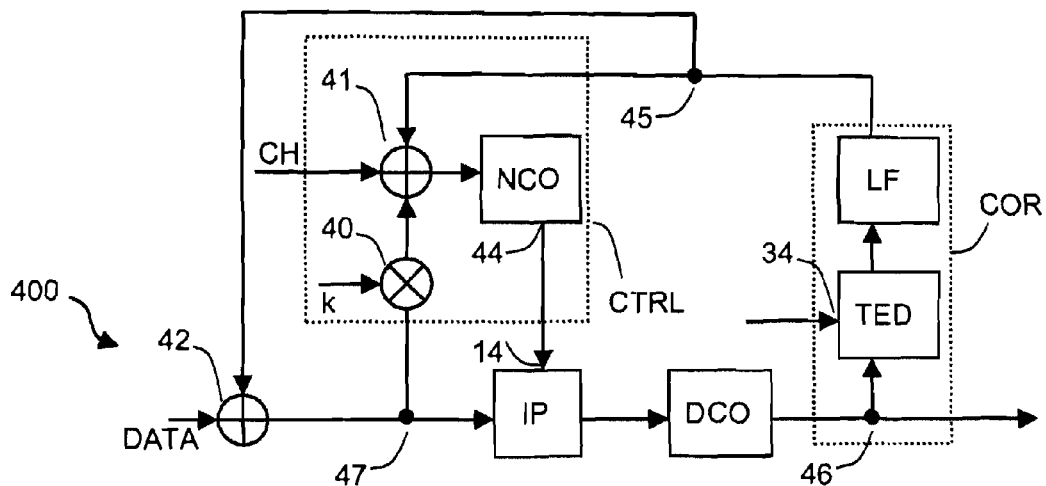

FIG. 4 schematically illustrates still another device as one illustrative embodiment.

Figure 5:
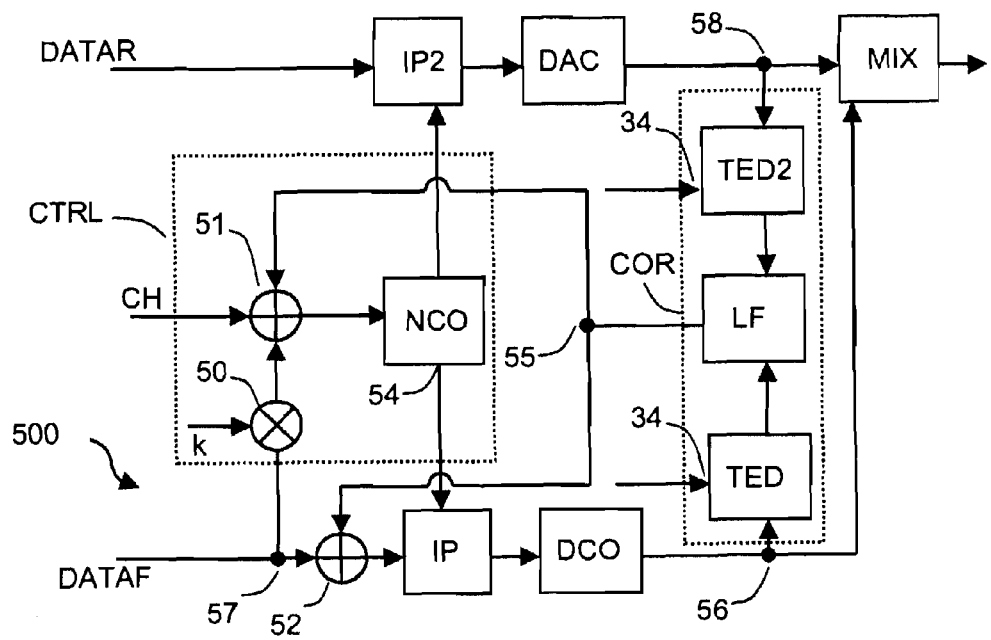

FIG. 5 schematically illustrates another device as one illustrative embodiment.

Figure 6:
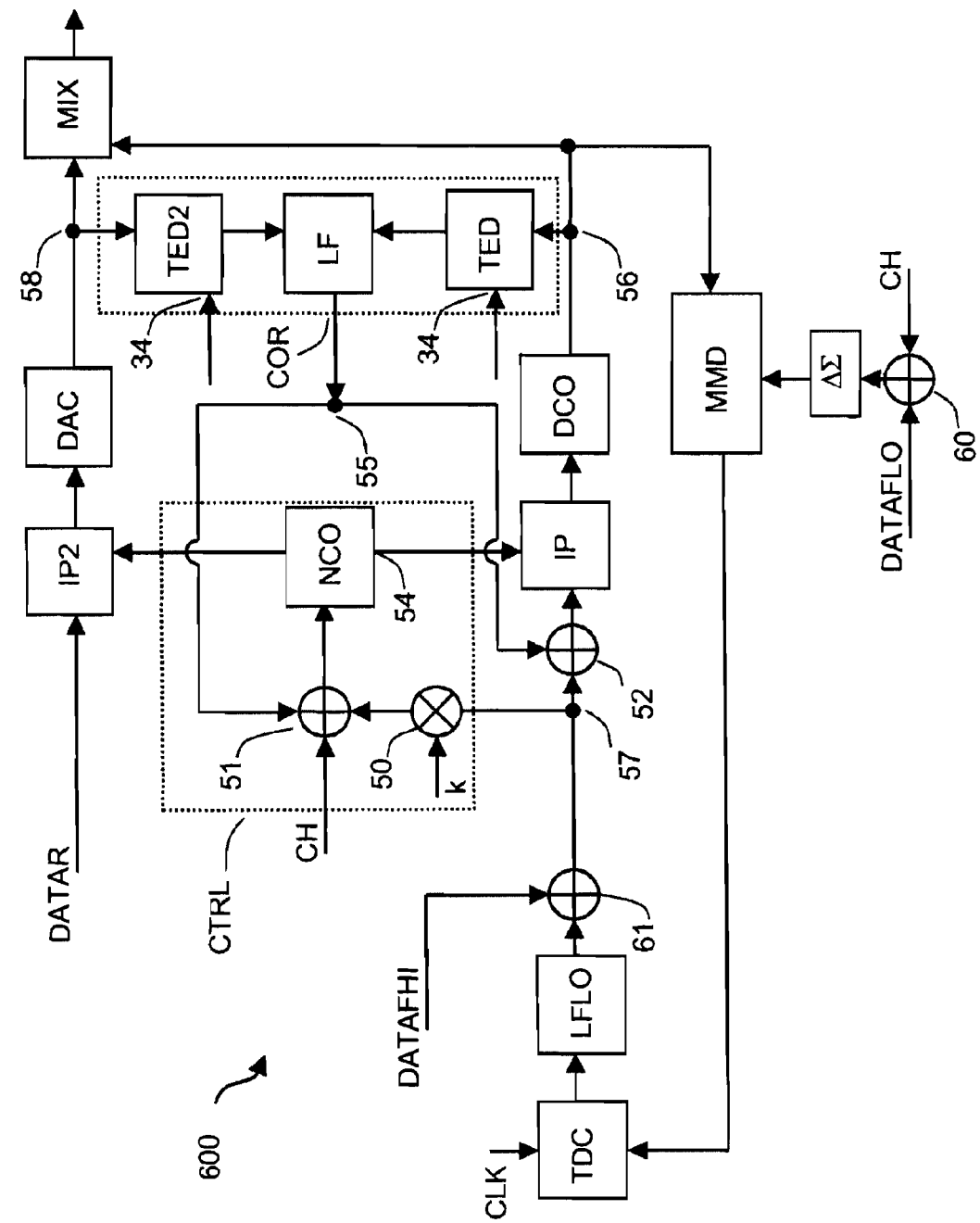

FIG. 6 schematically illustrates a still further device as one illustrative embodiment.

Figure 7:
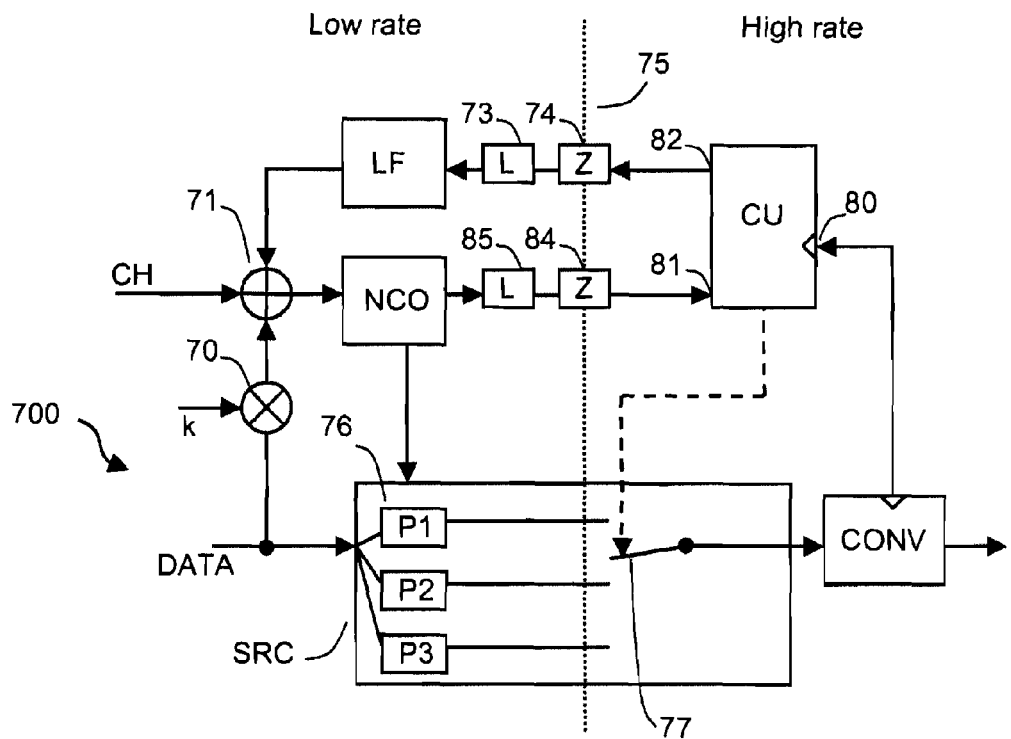

FIG. 7 schematically illustrates yet another device as one illustrative embodiment.

Figure 8:
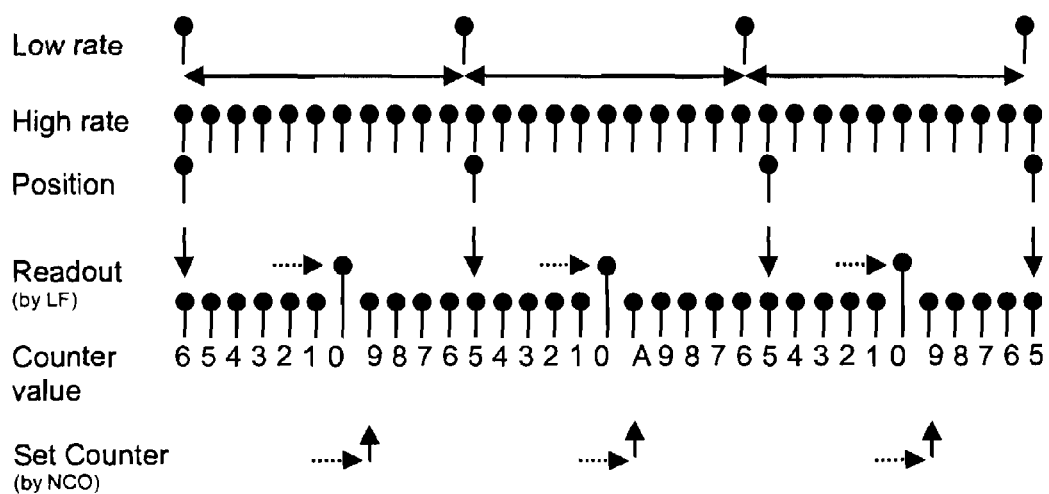

FIG. 8 schematically illustrates a method as one illustrative embodiment.

Figure 9:
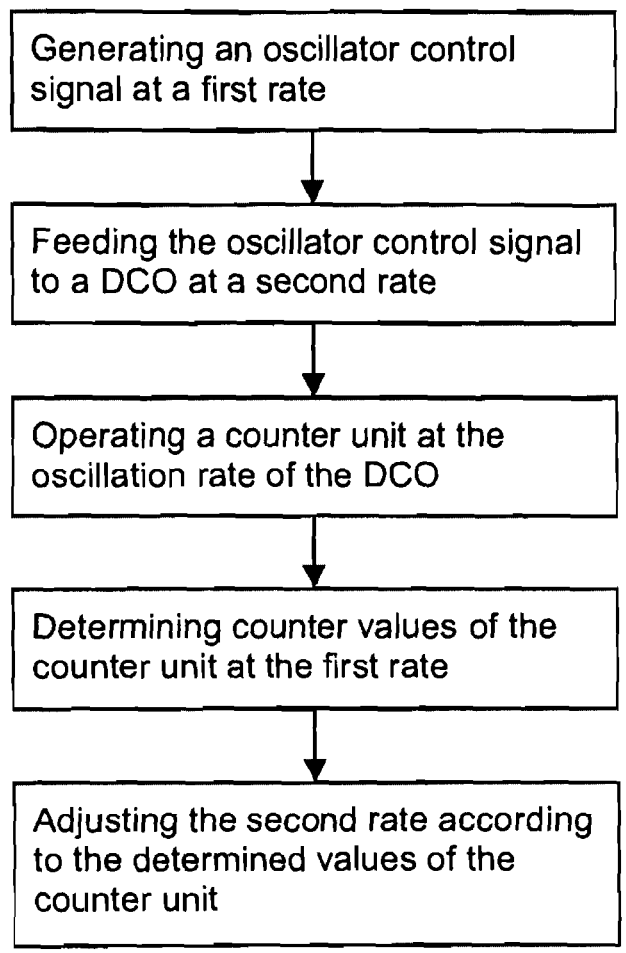

FIG. 9 schematically illustrates a method as one illustrative embodiment.

Figure 10:
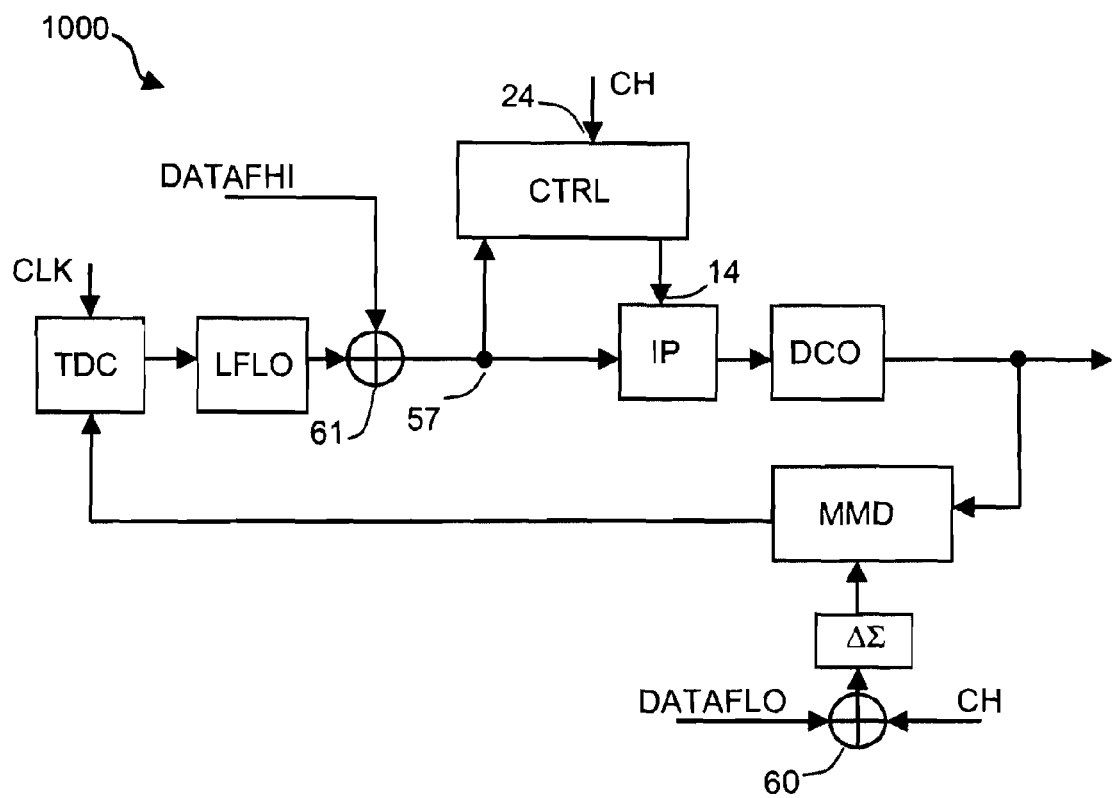

FIG. 10 schematically illustrates a further device as one illustrative embodiment.

Figure 11:
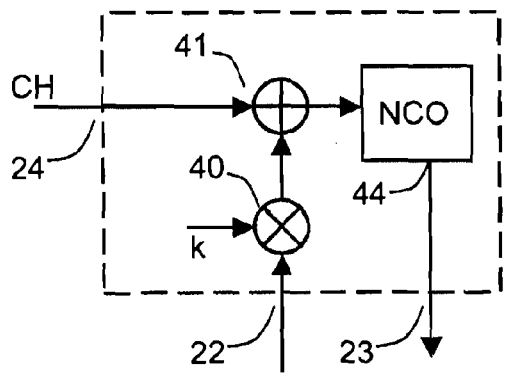

FIG. 11 schematically illustrates another device as one illustrative embodiment.

Figure 12:
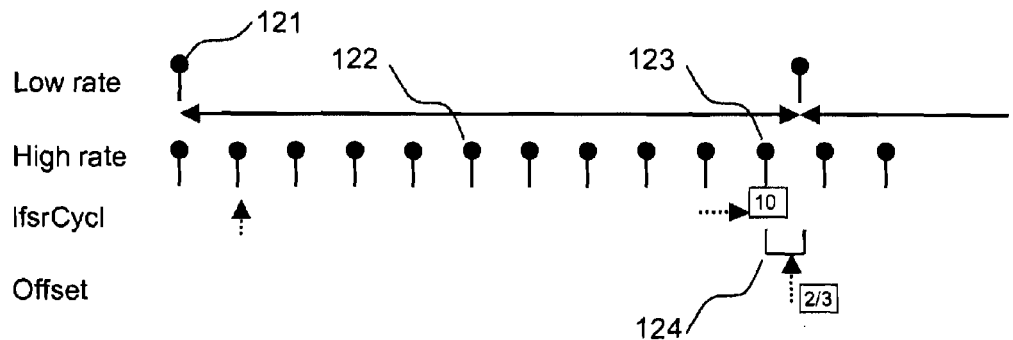

FIG. 12 schematically illustrates an illustrative timing diagram.

Figure 13:
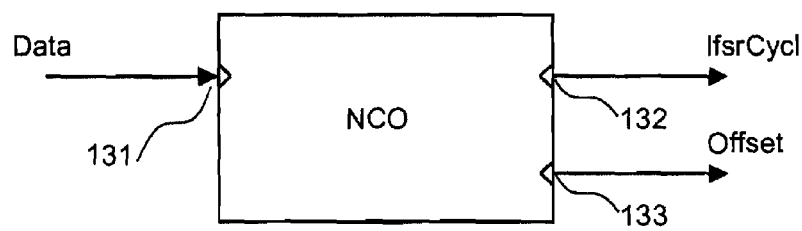

FIG. 13 schematically illustrates a still further device as one illustrative embodiment.

Figure 14:
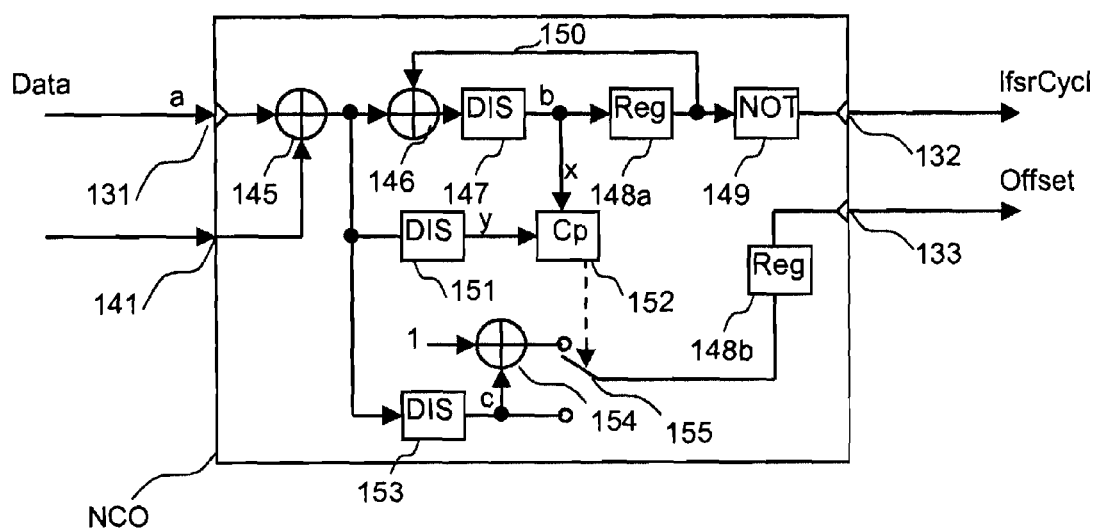

FIG. 14 schematically illustrates the device of FIG. 13 in more detail.

Figure 15:
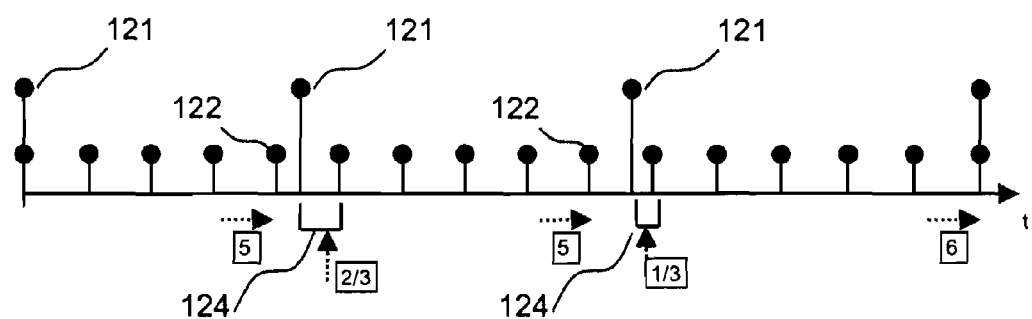

FIG. 15 schematically illustrates another illustrative timing diagram.

Figure 16:
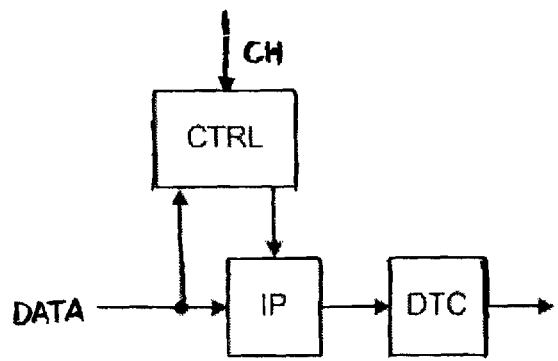

FIG. 16 schematically illustrates another device as one illustrative embodiment.

Figure 17:
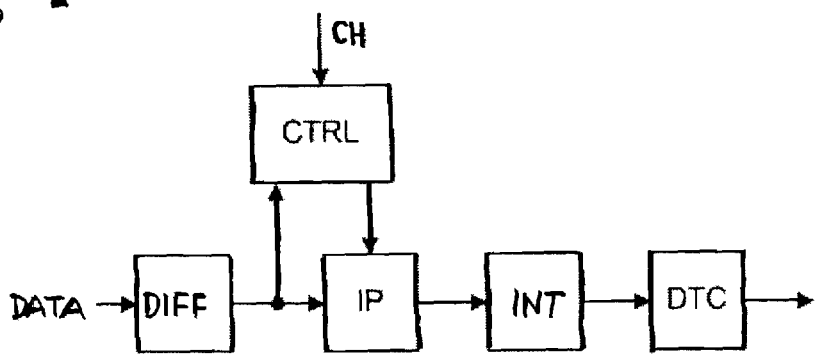

FIG. 17 schematically illustrates yet another device as one illustrative embodiment.

Figure 18:
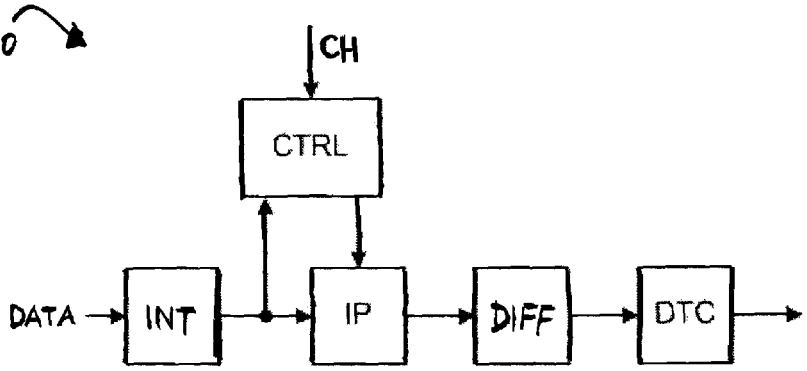

FIG. 18 schematically illustrates yet another device as one illustrative embodiment.

Figure 19:
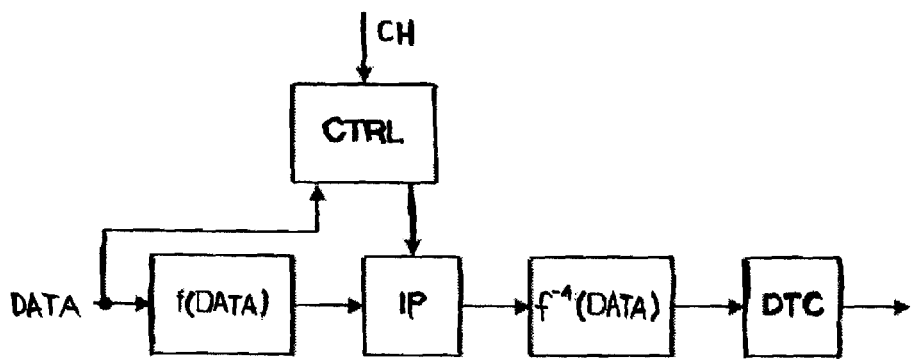

FIG. 19 schematically illustrates yet another device as one illustrative embodiment.

Figure 20:
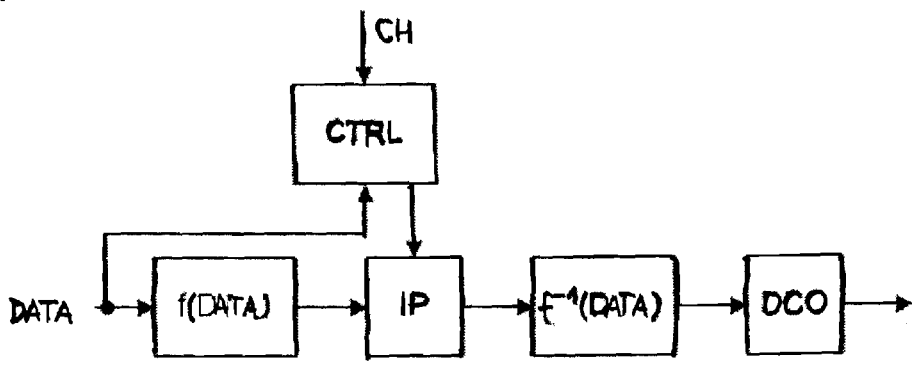

FIG. 20 schematically illustrates yet another device as one illustrative embodiment.

DETAILED DESCRIPTION

In the following, illustrative embodiments are described with reference to the drawings, wherein like reference numerals are generally utilized to refer to like elements throughout. In the following description, for purposes of explanation, numerous specific details are set forth in order to provide a thorough understanding of one or more aspects of illustrative embodiments. However, it may be evident to a person skilled in the art that one or more aspects of the illustrative embodiments may be practiced with a lesser degree of these specific details. The following description is therefore not to be taken in a limiting sense, and the scope of protection is defined by the appended claims.

In addition, while a particular feature or aspect of an illustrative embodiment may be disclosed with respect to only one of several implementations, such feature or aspect may be combined with one or more other features or aspects of the other implementations as may be desired and advantageous for any given or particular application.

Digitally controlled oscillators as referred to herein may be devices suitable for converting a digital control signal, which may e.g. be a digital control word or a series of digital control words, fed to a control signal input of the digitally controlled oscillator to an analog signal. The digital control signal fed to a digitally controlled oscillator may include information on the frequency with which the digitally controlled oscillator should oscillate. The digitally controlled oscillator may be configured to receive an item of information of the digital control signal, e.g., a digital control word, and use the received information of the fed digital control word to perform a single oscillation or multiple oscillations according to the frequency information within the digital control word. After having performed a certain amount of oscillations, for example one oscillation, the digitally controlled oscillator may be configured to receive the next item of information fed to its control signal input. Depending on the frequency of the performed oscillations, the time span between subsequent receiving operations of a digital control word at the control signal input of the digitally controlled oscillator may vary. In other words, the digitally controlled oscillator may set its own operational rate according to the frequency with which it oscillates.

Similarly to digitally controlled oscillators, circuits for converting a digital control signal to an analog signal may operate in the same way, such circuits for example being digital-to-analog converters. Such circuits may receive their operational rate from digitally controlled oscillators.

FIG. 1 schematically illustrates a device 100 as an illustrative embodiment. The device 100 may have a digitally controlled oscillator DCO with a control signal input 12 and an output 13. The digitally controlled oscillator DCO is configured to receive a digital control signal at the control signal input 12, to perform oscillations according to the information of the digital control signal and to output an analog output at the output 13. The device 100 further may have an interpolating device IP, such as for example an interpolator or a sampling rate converter, in particular a fractional sampling rate converter, having a data input 10 which may be fed with a digital data signal DATA. The interpolating device IP may be configured to interpolate the digital data signal DATA according to a variable interpolation rate and to provide an interpolated output of the digital data signal DATA at an output 11. The digital data signal DATA may be fed to the interpolating device IP with a data signal rate and the interpolated data signal may be output at the output 11 with an interpolated data signal rate. In particular, the data signal rate may be lower than the interpolated data signal rate. However, the ratio of the data signal rate and the interpolated data signal rate may be of any amount. The interpolating device IP may further have a control input 14 where the interpolation rate may be varied according to a control signal.

The data signal DATA may carry information about a desired oscillation rate of the digitally controlled oscillator DCO, in particular the data signal DATA may be a digital signal including a series of digital control words configured to control the oscillation rate of the digitally controlled oscillator DCO. The digital control words may carry coded information about the oscillation rate of the digitally controlled oscillator DCO. The data signal DATA may be fed to the interpolating device IP at a constant rate. The information carried by the data signal DATA may be used to generate a control signal configured to control the interpolation rate of the interpolating device IP. In particular, the interpolation rate may depend on the ratio of the desired oscillation rate of the digitally controlled oscillator DCO as given by the information carried by the data signal DATA and the actual data signal rate. For example, if the data signal DATA is fed to the input 10 with a first data signal rate R1 and within the information contained in the data signal DATA the desired oscillation rate is set to R2, the interpolating device IP is controlled such that the interpolation rate is R2/R1, i.e. for every sample of the data signal DATA R2/R1 samples are output at the output 11 of the interpolating device IP. Other dependencies of the interpolation rate on the ratio of the data signal rate and the desired oscillation rate of the digitally controlled oscillator DCO are possible as well.

The digitally controlled oscillator DCO may be configured to receive a sample at the output 11 of the interpolating device IP whenever the previous oscillation has been completed. Thus, by providing an amount of samples at the output 11 of the interpolating device IP, it may be provided that for every sample of the data signal DATA fed to the input 10 of the interpolating device IP there are enough samples generated to satisfy the need for new samples of the digitally controlled oscillator DCO.

To illustrate this further, one might consider the scenario where the data signal rate and the interpolation rate would be kept constant. Consider further the case that, as time passes, the desired oscillation rate rises. Then, the time required for the digitally controlled oscillator DCO to complete an oscillation would shorten, thus shortening the time between two consecutive receiving operations of new samples at the input 12 of the digitally controlled oscillator DCO. Due to the interpolation rate being assumed as constant, the interpolated samples provided at the output 11 of the interpolating device IP would be used as input to the digitally controlled oscillator DCO in a shorter time period than with a lower desired oscillation rate. Thus, after that shorter time period the digitally controlled oscillator DCO would receive samples of the interpolated data signal which would have only been received later, if the desired oscillation rate had not been raised, possibly leading to inaccuracies in the control of the oscillation. One skilled in the art will note, that a similar scenario may apply, if the desired oscillation rate would decrease.

By providing a variable amount of sample values of the interpolated digital data signal in a given time period at the output 11 of the interpolating device the time required for the digitally controlled oscillator DCO to receive the provided variable amount of sample values may be adjusted to the time span during which the desired oscillation frequency should be upheld. Consider the example where the digital data signal is fed to the input 10 of the interpolating device IP at a data signal rate R1 and the digitally controlled oscillator DCO originally oscillates with the oscillation frequency f2 corresponding to a sample value receiving rate R2 at the input 12 of the digitally controlled oscillator DCO. In this case it may take a time T2 for the digitally controlled oscillator DCO to receive n sample values of the interpolated digital control signal at the output 11 of the interpolating device IP, wherein n=R2/R1. If, for example, the desired oscillation frequency then rises to a value f3>f2, the oscillator may oscillate with an oscillation frequency f3 corresponding to a sample value receiving rate R3, with R3>R2. The interpolation rate of the interpolating device IP may then be increased, so that more sample values of the digital control signal are provided at the output 11 of the interpolating device IP. In particular, the interpolation rate may be increased to R3/R1. It will then take a time T3 for the digitally controlled oscillator DCO to receive m sample values of the interpolated digital control signal at the output 11 of the interpolating device IP, wherein m=R3/R1. Although the sample value receiving rate R3 is higher than the sample value receiving rate R2, the amount of sample values of the interpolated digital control signal m is higher than the amount n before. Therefore, the time T3 will be equal to the time T2. In other words, an adjustment of the interpolation rate of the interpolating device IP may be used to compensate for variations of the sample value receiving rate of the digitally controlled oscillator DCO. As one skilled in the art will recognize, a similar example can be given, if the oscillation frequency of the digitally controlled oscillator DCO drops to f4<f2.

FIG. 2 schematically illustrates a device 200 as an illustrative embodiment. The device 200 is similar to the device 100 in that it may have an interpolating device IP and a digitally controlled oscillator DCO similar to the respective ones in device 100. Furthermore, similar to device 100, a digital data signal DATA may be provided to the interpolating device IP. The device 200 may have a control unit CTRL configured to control the interpolation rate of the interpolating device IP. The control unit CTRL may have a first input 22, a second input 24 and an output 23. The first input 22 may be fed with the digital data signal DATA, which may be branched off at a node 21 arranged upstream of the input 10 of the interpolating device IP. The output 23 may be coupled to the control input 14 of the interpolating device IP where the interpolation rate may be varied according to a digital control signal generated by the control unit CTRL. The second input 24 may be configured to receive a reference signal.

The reference signal may, for example, be a channel frequency CH. The device 200 may be used for generating oscillations at the digitally controlled oscillator DCO with oscillation frequencies within a certain frequency range around an average frequency. This average frequency may be the channel frequency CH, for example a carrier frequency of a transmission channel in a radio application. Data signals may be modulated on the carrier frequency resulting in oscillation frequencies within a small range around the carrier frequency. The channel frequency CH may be used to define an average interpolation rate for the interpolating device IP. For example, if the data signal rate of the digital data signal DATA may be 20 MHz and the channel frequency may be 10 GHz, the average interpolation rate of the interpolating device may be 500 interpolated sample values per sample value of the digital data signal DATA. Let for example the interpolated digital control signal have the values 0, −25 and 50. The corresponding modulation swing intended to be controlled with these values may be 0, −500 MHz and +1 GHz, respectively. The interpolation rates to be applied are 10000/20+0=500, 10000/20−25=475 and 10000/20+50=550, respectively. Other values for the data signal rate and the channel frequency may be used as well. The device 200 may be coupled in a phase locked loop (PLL) circuit as illustrated and described further below in FIG. 10. One possible illustrative embodiment of the control unit CTRL is described in further detail in FIG. 11.

FIG. 3 schematically illustrates a device 300 as an illustrative embodiment. The device 300 is similar to the devices 100 and 200 in that it may have a digitally controlled oscillator DCO similar to the respective ones in the devices 100 and 200. The device 300 may have a sampling unit SU having an input 10 and an output 11. The input 10 is fed with a digital data signal DATA similar to the digital data signals in the devices 100 and 200. The sampling unit SU may be an interpolating device similar to the interpolating device IP in the devices 100 and 200. The sampling unit SU may also be a sample and hold register configured to receive sample values of the digital data signal DATA at the input 10 and store them within hold registers which may be accessed at the output 11 by the digitally controlled oscillator DCO.

The device 300 may have a timing correction unit having a timing error detector TED which is configured to operate at an operational rate given by the oscillation frequency of the digitally controlled oscillator DCO. The timing error detector TED may thus have an input 31 coupled to the output 13 of the digitally controlled oscillator DCO via a node 33 downstream of the digitally controlled oscillator DCO. It may further have an input 34, which may be configured to receive the digital data signal DATA or a signal derived from the digital data signal DATA and being representative of the information in the digital data signal DATA. If the sampling unit SU is embodied as a sample and hold register, the timing error detector TED may be configured to control the access rate of the digitally controlled oscillator DCO to the hold registers of the sample and hold register via a control path 32. If the sampling unit SU is embodied as an interpolator, a sampling rate converter, in particular a fractional sampling rate converter, or a similar interpolating device, the timing error detector TED may be configured to control the interpolation rate of the sampling unit SU via control path 32.

The timing error detector TED may be configured to detect a deviation of the momentary oscillation frequency of the digitally controlled oscillator DCO from the desired oscillation frequency as given by the information in the digital data signal DATA. If the momentary oscillation frequency of the digitally controlled oscillator DCO is larger than the desired oscillation frequency, the timing error detector TED may control the sampling unit in such a way that the digitally controlled oscillator DCO is instructed to receive sample values at the output 11 of the sampling unit less frequently. On the other hand, if the momentary oscillation frequency of the digitally controlled oscillator DCO is lower than the desired oscillation frequency, the timing error detector TED may control the sampling unit in such a way that the digitally controlled oscillator DCO is instructed to receive sample values at the output 11 of the sampling unit more frequently. If the digitally controlled oscillator DCO would be an ideal digitally controlled oscillator, the output of the timing error detector TED would be zero or a value equivalent to zero error. The timing error detector TED may further be configured to be provided with the rate of the digital data signal DATA as a reference rate in comparison to the oscillation frequency of the digitally controlled oscillator DCO. A more detailed implementation of a timing error detector TED is illustrated in FIG. 8. It is to be noted that the circuitry shown in FIG. 3 is a feedback structure configured to control the oscillation frequency output of the digitally controlled oscillator to conform to the desired oscillation frequency as defined by the information in the digital data signal DATA. Thus, the function of the feedback loop having the timing error detector TED and the sampling unit SU is similar to the function of the conventional feedback loop in a PLL circuit and thus may replace or supplement such conventional PLL feedback loop. It is to be noted that the feedback loop of FIG. 3 including the timing error detector TED and the sampling unit SU may be implemented without a multi modulus divider and/or a noise shaper as typically contained in conventional PLL feedback loops.

FIG. 4 schematically illustrates a device 400 as an illustrative embodiment. The device 400 is similar to the devices 100 and 200 in that it may have a digitally controlled oscillator DCO and an interpolating device IP similar to the respective ones in the devices 100 and 200. Furthermore, it may have a control unit CTRL similar to the control unit CTRL as shown in FIG. 2 and a timing error detector TED similar to the timing error detector TED as shown in FIG. 3.

The control unit CTRL as indicated by a dotted line is shown in greater detail in FIG. 4 and the components of the control unit CTRL detailed below may be similar to the ones in the control unit CTRL of FIG. 2. The difference between the control unit CTRL in FIG. 4 and the control units CTRL in FIGS. 2 and 11 is that the one in FIG. 4 additionally may have an input coupled to the node 45. The control unit CTRL may have a numerically controlled oscillator NCO having an output 44 coupled to the control input 14 of the interpolating device IP, a summing unit 41 having an output coupled to an input of the numerically controlled oscillator NCO, a first input coupled to the node 45, a second input coupled to a channel frequency input CH of the control unit CTRL and a third input. The control unit CTRL may further have a multiplier 40 having a first input coupled to a node 47, a second input configured to receive a normalization constant k and an output coupled to the third input of the summing unit 41.

The multiplier 40 may be configured to receive the digital data signal DATA, which may optionally be modified by the input to a summing unit 42. In other embodiments, the summing unit 42 may be omitted and the digital data signal DATA may be fed to the multiplier 40 unmodified. At the multiplier 40 the digital data signal may be normalized by a normalization constant k. In particular, the normalization constant k may be used to convert information values coded as digital control words of the digital data samples into actual frequency values. The summing unit 41 may receive a channel frequency value CH which may be added to the output of the multiplier 40. The summing unit 41 may further be configured to add an additional frequency value supplied from a timing correction unit COR described below via node 45 to the channel frequency value CH and the output of the multiplier 40. The output of the summing unit 41 may be provided as input to the numerically controlled oscillator NCO. The numerically controlled oscillator NCO may be configured to generate a control signal according to the input of the summing unit 41, which control signal may be used to control the interpolation rate of the interpolating device IP. One skilled in the art will recognize, that it may equally be possible for the numerically controlled oscillator NCO to control a sample and hold register as described in FIG. 3, wherein the control signal of the numerically controlled oscillator NCO may be used to control the rate at which the digitally controlled oscillator DCO is receiving sample values of the hold registers of the sample and hold register.

As depicted in FIG. 4, the device 400 may have a summing unit 42 upstream of the interpolating device IP. The summing unit 42 is illustratively shown as being arranged upstream of the node 47 at which the (modified) digital data signal DATA is branched off to an input of the control unit CTRL. However, it may also be provided that the summing unit 42 is arranged downstream of the node 47 and upstream of the interpolating device IP. The summing unit 42 is configured to receive a correction signal of the timing correction unit COR described below via node 45. In this case, the output of the timing correction unit COR may or may not be fed to the control unit CTRL. Also, the summing unit 42 may be omitted with the output of the timing correction unit COR only being fed to the control unit CTRL.

The timing correction unit COR may include a timing error detector TED as described in FIG. 3. The timing correction unit COR may also include a loop filter LF having an input coupled to the output of the timing error detector TED and having an output coupled to an input of the control unit CTRL and/or an input of the summing unit 42. The timing error detector TED may be operable at an operational rate corresponding to the oscillation frequency of the digitally controlled oscillator DCO and may be configured to detect a deviation of the oscillation frequency of the digitally controlled oscillator DCO from the desired oscillation frequency as given by the information in the digital data signal DATA. To this end, the timing error detector TED receives information representative of the desired oscillation frequency and/or of the sample rate of the digital data signal DATA at a reference input 34 (by way of example, in the specific embodiment shown in FIG. 7, the reference input 34 of the timing error detector TED is provided by counter input 81). The timing error detector TED may be configured to output a timing error signal to the loop filter LF. In particular, the loop filter LF may be configured as a broadband loop filter LF. The output of the loop filter LF may be used as a correction signal for the digital data signal DATA and or the input signal for the numerically controlled oscillator NCO.

FIG. 5 schematically illustrates a device 500 as an illustrative embodiment. The device 500 is similar to the devices 100, 200 and 400 in that it may have a digitally controlled oscillator DCO and an interpolating device IP similar to the respective ones in the devices 100 and 200. The device 500 may further have a control unit CTRL similar to the control unit CTRL in FIG. 4 including a numerically controlled oscillator NCO, a multiplier 50 with an input for a normalization constant k and an input for a digital data signal DATAF branching off at a node 57 arranged upstream of the interpolating device IP, a summing unit 51 with an input for a channel frequency CH and an output coupled to the interpolating device IP2 via the numerically controlled oscillator NCO. The device 500 may further include a timing correction unit COR having a timing error detector TED and a loop filter LF similar to the respective timing error detector TED and the loop filter LF in FIG. 4.

The device 500 may have a second interpolating device IP2, which may in particular be embodied as an interpolator or fractional sampling rate converter or sample and hold register as discussed in conjunction with FIGS. 1 to 4. The second interpolating device IP2 may have a control input coupled to a second output of the numerically controlled oscillator NCO in the control unit CTRL. The device 500 may have a digital-to-analog converter DAC having an input coupled to an output of the second interpolating device IP2. The device 500 may have a mixer MIX having a first input coupled to the digitally controlled oscillator DCO via node 56 and a second input coupled to the digital-to-analog converter DAC via a node 58. The node 58 may be located downstream of the digital-to-analog converter DAC and upstream of the mixer MIX where an output of the digital-to-analog converter DAC may be branched off to a second input of the timing correction unit COR. The timing correction unit COR may include a second timing error detector TED2 having an input coupled to the node 58 and an output coupled to the loop filter LF. An output of the loop filter LF may be coupled via a node 55 to an input of the control unit, in particular to an input of the summing unit 51, and to an input of an optional summing unit 52. If present, the summing unit 52 may be arranged upstream of interpolating device IP and be configured to output a sum of the digital data signal DATAF and the output of the loop filter LF. The summing unit 52 is illustratively shown as being coupled between the node 57 and the interpolating device IP. Also, the summing unit 52 may be arranged upstream of the node 57. Although not shown in FIG. 5, it is to be noted, that a further optional summing unit may also be arranged upstream of the second interpolating device IP2, the further summing unit being configured to output a sum of a digital data signal DATAR and the output of the loop filter LF to the second interpolating device IP2. To this end, an input of the further summing unit may be coupled to the node 55.

It may further be possible to arrange a further node upstream of the interpolating device IP2 where the digital data signal DATAR is branched off to a further multiplier similar to the multiplier 50. The further multiplier may be arranged to output the product of the digital data signal DATAR branched off at the further node and a normalization constant k to a further input of the summing unit 51. The summing unit 51 may then be configured to build a sum of the channel frequency CH, the input of the node 55, the input of the multiplier 50 and the input of the further multiplier and to output that sum to the numerically controlled oscillator NCO. As one skilled in the art will recognize, numerous variations of arrangements of summing units upstream of the interpolating devices IP and IP2 and inputs to the summing unit 51 are possible, all of which are included in the scope of the illustrative embodiment shown in FIG. 5. In other words, the output of the loop filter LF to the node 55 may be provided to any combination of inputs of the group of summing units which may include the summing unit 51 and/or the summing unit 52 and/or a further summing unit arranged upstream of the second interpolating device IP2. Any of these combinations may involve providing a node upstream of the respective interpolating devices IP and IP2 where one of the respective digital data signals DATAF and DATAR may be branched off to one of two respective multipliers which may each be configured to output a product of a normalization constant with each of the respective digital data signals DATAF and DATAR to a respective input of the summing unit 51. Moreover, any of the thus arranged combinations may further involve arranging the respective summing unit upstream of the respective interpolating devices IP and IP2 either upstream or downstream of the respective node upstream of the respective interpolating devices IP and IP2 where one of the respective digital data signals DATAF and DATAR may be branched off.

The device 500 may be used for generating an analog output signal at the mixer MIX. A first digital data signal DATAF, in particular a digital frequency data signal of a polar radio transmitter, may be provided at the input of the interpolating device IP. A second digital data signal DATAR, in particular a digital radial data signal of a polar radio transmitter, may be provided at the input of the interpolating device IP2. The first and the second digital data signals DATAF and DATAR may have similar properties as described in conjunction with the digital data signals DATA in FIGS. 1 to 4. The interpolating devices IP and IP2 are configured to interpolate the digital data signals DATAF and DATAR, respectively, using a controllable interpolation rate. The interpolation rate may be controlled by control signals generated by the numerically controlled oscillator NCO and input to control inputs of the interpolating devices IP and IP2. The interpolated digital data signals may be received sample by sample at the digitally controlled oscillator DCO and the digital-to-analog converter DAC, respectively. The digital-to-analog converter DAC may be operable at an operational rate which is controlled by the operational rate of the digitally controlled oscillator DCO. In other words, the oscillation frequency of the digitally controlled oscillator DCO may control the rate at which the digitally controlled oscillator DCO and the digital-to-analog converter DAC may receive samples at the outputs of the respective interpolating devices IP and IP2. The outputs of the digitally controlled oscillator DCO and the digital-to-analog converter DAC may be branched off at nodes 56 and 58, respectively, to the timing error detectors TED and TED2, respectively. The timing error detectors TED and TED2 may be configured to detect a timing error of the oscillation frequency of the digitally controlled oscillator DCO with respect to the desired oscillation frequency as given by the information in the digital data signals DATAF and DATAR, respectively. To this end, the timing error detectors TED and TED2 may have inputs 34 similar to the input 34 of the timing error detector TED in FIGS. 3 and 4. The function of the timing error detectors TED and TED2 is similar to the function of the timing error detector TED described in FIG. 3. The outputs of the timing error detectors TED and TED2 may be fed to the loop filter LF which in turn may output filtered error values to the summing unit 52, the summing unit 51 and the possibly arranged further summing unit upstream of the interpolating device IP2.

The outputs of the digitally controlled oscillator DCO and the digital-to-analog converter DAC may be input to the mixer MIX which may be configured to generate a mixed analog output signal, in particular a mixed radial and frequency output signal for radio transmission of a polar radio transmitter. The mixer MIX may be operable at the same rate as the digitally controlled oscillator DCO and the digital-to-analog converter DAC, in particular at a radio frequency of 900 MHz. With respect to FIGS. 4 and 5, the nodes 45 and 55 may also be configured to not be coupled to the adding units 41 and 51, respectively, i.e. the output of the loop filters LF need not be fed to the control unit CTRL. It may also be possible for the adding units 42 and/or 52 to be omitted, i.e. the output of the loop filters LF need not be fed back to the input line to the interpolating device IP. In any of the illustrative embodiments in FIGS. 4 and 5, a combination of the feedback structure to the input line to the interpolating device IP may be embodied, i.e. for example an adding unit similar to the adding unit 52 may be included in the device 400 or an adding unit similar to the adding unit 42 may be included in device 500.

It may further be possible to omit both of the timing error detectors TED and TED2 in the device 500 so that the control of the interpolation rate of the interpolating devices IP and IP2 may be governed by the input of the digital data signals DATAF and DATAR in a feedforward structure similar to the control of the interpolation rate as shown in FIG. 2. Further, it is possible to omit the timing error detector TED, i.e. to only provide the timing error detector TED2. In this case, the timing error computed by the timing error detector TED2 and used for feedback control is based on the radial information contained in the radial data signal DATAR.

FIG. 6 schematically illustrates a device 600 as an illustrative embodiment. The device 600 is similar to the device 500 wherein the same reference signs and numerals are used to denote the same components as in FIG. 5 throughout. The device 600 may further include a multi modulus divider MMD having a first input coupled to an output of the digitally controlled oscillator DCO and a second input coupled to the output of a sigma delta converter ΣΔ. The sigma delta converter ΣΔ may have an input coupled to an output of an adding unit 60 having a first input configured to receive a low pass digital data signal DATAFLO and a second input configured to receive the channel frequency CH. The multi modulus divider MMD may have an output coupled to a first input of a time-to-digital converter TDC. A second input of the time-to-digital converter TDC may be configured to receive a reference clock CLK and an output of the time-to-digital converter TDC may be coupled to an input of a low pass loop filter LFLO. An output of the low pass loop filter LFLO may be coupled to a first input of an adding unit 61 having a second input configured to receive a high pass digital data signal DATAFHI and having an output coupled to the node 57 and to the data input of the adding circuit 52.

The multi modulus divider MMD may be configured to divide the output of the digitally controlled oscillator DCO. The division ratio may be dependent on the noise shaped sum of channel frequency CH and the low pass portion of the digital data signal DATAFLO, in particular the low pass portion of the digital frequency data signal in a polar radio transmitter, which sum may be generated by the adding unit 60 and noise shaped by the sigma delta converter ΣΔ. After division the output signal of the digitally controlled oscillator DCO may be compared with a reference clock signal CLK at the time-to-digital converter TDC which may convert the difference of the divided output signal of the digitally controlled oscillator DCO and the reference clock CLK to a digital error value. The digital error value may then be filtered by a low pass loop filter LFLO, which may in particular be a narrow band loop filter. The narrow band loop filter may be configured to suppress the high frequency noise generated by the sigma delta converter ΣΔ. After filtering, the digital error value may be added to the high pass portion of the digital data signal DATAFHI, in particular the high pass portion of the digital frequency data signal in a polar radio transmitter. The sum of the high pass portion of the digital data signal DATAFHI and the digital error value may then be used as input to the adding circuit 52, which output is used as input to the interpolating device IP.

One skilled in the art will recognize that a similar phase locked loop as described above may be arranged for the digital-to-analog conversion path including the interpolating device IP2 and the digital-to-analog converter DAC as well. In particular, it may be possible to arrange a phase locked loop arrangement for each of the data signal paths at the same time. It may also be possible to only arrange a phase locked loop arrangement for the radial data signal path and to omit the phase locked loop arrangement for the frequency data signal path. Moreover, the phase locked loop arrangement detailed above may be arranged for any of the devices 100, 200, 300, 400 or 500.

FIG. 7 schematically illustrates a device 700 as an illustrative embodiment. The device 700 may include a sampling rate converter SRC, a converting unit CONV, a counter unit CU, a numerically controlled oscillator NCO and a loop filter LF. A data input of the sampling rate converter SRC may be fed with a digital data signal DATA similar to the digital data signals in FIGS. 1 to 4. The sampling rate converter SRC may have a portion operating at a low operating rate and a portion operating at a high operating rate. The low operating rate may be given by the updating rate, i.e. the sample rate, of the digital data signal DATA, i.e. the updating frequency of digital control words which may be included in the digital data signal DATA. The sampling rate converter SRC may in particular be a fractional sampling rate converter with a variable and controllable sampling rate. The sampling rate converter SRC may include branching paths, each path having a polyphase filter P1, P2, P3 76. The number of branching paths and polyphase filters 76 shown is illustratively set to 3, however, any number of polyphase filters 76 and branching paths may be implemented in the sampling rate converter SRC. The sampling rate converter SRC may include a controllable switch 77 downstream of the polyphase filters 76, wherein the controllable switch 77 is configured to selectively couple one of the polyphase filters 76 to an output terminal of the controllable switch 77 at a time. The output terminal of the controllable switch 77 may be coupled to an output of the sampling rate converter SRC. The sampling rate converter SRC may be configured to provide an interpolated digital data signal to a data input of a converting unit CONV. Although a sampling rate converter SRC having a plurality of branching paths and polyphase filters 76 is shown, this implementation merely serves as an illustrative implementation and any other type of sampling rate converter SRC capable of providing a variable and controllable sampling rate may be used as well.

The converting unit CONV may be a circuit for converting a digital input signal to an analog output signal at an operational clock rate. The operational clock rate of the converting unit CONV may in particular be the high operating rate with which one portion of the sampling rate converter SRC is operated. The operational clock rate may depend on the value of the digital control words included in the interpolated digital data signal which is output by the sampling rate converter SRC. The converting unit CONV may in particular be a digitally controlled oscillator similar to the digitally controlled oscillator DCO in FIGS. 1 to 6 or a digital-to-analog converter similar to the digital-to-analog converter DAC in FIG. 5 or 6. The converting unit CONV may be configured to output an analog output signal.

The operational clock rate of the converting unit CONV may be used to control the operating rate of a counter unit CU. The counter unit CU may have a clock input 80 configured to receive a signal representative of the operational clock rate, i.e. a clock signal, of the converting unit CONV. In particular, the counter unit CU may be configured to count at each tick of the clock signal. The counter unit CU may have a first input 81 configured to be coupled to a counter control signal of a numerically controlled oscillator NCO. The counter control signal output by the numerically controlled oscillator NCO is fed to a lookup table 85, an output of which is fed to a hold register 84. An output of the hold register is fed to the first input 81 of the counter unit CU. The counter unit CU may have an output 82 coupled to a hold register 74, which may have an output coupled to a lookup table 73. The lookup table 73 may have an output coupled to an input of a loop filter LF. The counter unit CU may be configured to control the controllable switch 77 included in the sampling rate converter SRC. In particular, the counter unit CU may be configured to control the timing of the switching of the controllable switch 77 and may control which of the polyphase filters 76 is coupled to the output of the sampling rate converter SRC at any given time.

An output of the loop filter LF may be coupled to a first input of an adding unit 71. The adding unit 71 may have a second input configured to receive a channel frequency signal CH similar to the channel frequency signal CH in FIGS. 2, 4, 5 and 6. The adding unit 71 may have a third input configured to receive an output of a multiplying unit 70. The multiplying unit 70 may have a first input configured to receive the digital data signal DATA and a second input configured to receive a normalization factor k. An output of the adding unit 71 may be coupled to an input of the numerically controlled oscillator NCO. The numerically controlled oscillator NCO may be configured to control the sampling rate of the sampling rate converter SRC.

One skilled in the art will recognize that other embodiments not shown in FIG. 7 may also be derived. For example, in the device 700 it may be possible to provide a further adding unit upstream of the sampling rate converter SRC. The further adding unit may be configured to receive the digital data signal DATA at a first input and an output of the loop filter LF at a second input. The further adding unit may be configured to output a sum of the digital data signal DATA and an output signal of the loop filter LF and feed it to the sampling rate converter SRC. Many other possibilities may be obvious to one skilled in the art, when combining features of the devices shown in FIGS. 1 to 7.

With reference to FIG. 8 an illustrative method of operating the device 700 is now given. FIG. 8 shows ticks of the rigid, equidistant signal rate at a low rate in the first line. The low rate may be an operational rate of the components in device 700 of FIG. 7 which are shown on the left hand side of the dotted line. The sampling rate converter SRC of device 700 may have a left hand portion which may be operable with the low rate. FIG. 8 shows ticks of the signal rate at a high rate in the second line. The high rate may be an operational rate of the components in device 700 of FIG. 7 which are shown on the right hand side of the dotted line. The sampling rate converter SRC of device 700 may have a right hand portion which may be operable with the high rate.

The high rate may be higher than the low rate by a factor of around 10 with respect to the low rate. The high rate and the low rate do not necessarily need to be commensurate. In particular, the high rate may be variable over time and may depend on digital control words included in the digital data signal DATA supplied to the sampling rate converter SRC. In that case the temporal distance between single ticks of the high rate may vary. In the third line of FIG. 8 only those ticks in the high rate are shown that are the first ticks to occur after ticks in the low rate.

A digital data signal DATA may be generated at the equidistant low rate, i.e. for every tick of the low rate a digital control word is issued in a serial fashion. The digital control words may contain information on a desired conversion rate of the converting unit CONV. In particular, the digital control words may be control words configured to control a digitally controlled oscillator DCO. The digital data signal DATA may be normalized with a normalization factor k and fed to the numerically controlled oscillator NCO. The numerically controlled oscillator NCO may be configured to calculate an optimum sampling rate for the sampling rate converter SRC which may depend on the low rate and the control information included in the digital data signal DATA. In particular, the optimum sampling rate may be calculated in such a way that it equals the ratio of the desired oscillation frequency of a digitally controlled oscillator and the update rate of the digital data signal. The numerically controlled oscillator NCO may generate a signal representative of the optimum sampling rate and feed it to the control input of the sampling rate converter SRC. The sampling rate converter SRC then interpolates the digital data signal DATA according to the optimum sampling rate.

The numerically controlled oscillator NCO may generate a counter control signal for the counter unit CU. The counter unit CU may be configured as a decremental counter, i.e. the counter unit CU starts at a predetermined integer counter value and decreases the counter value by 1 at every tick of the operational rate of the counter unit CU. The operational rate of the counter unit CU may be dependent on the operational rate of the converting unit CONV, for example the oscillation frequency of a digitally controlled oscillator DCO. This decremental behavior is shown in the last line of FIG. 8. At the first tick shown the counter value of the counter unit is 6. At the second tick shown in the last line which coincides with the second tick shown in the second line of FIG. 8, the counter value is decreased by 1 to the value of 5. This pattern continues until at the seventh tick shown in the last line of FIG. 8 the counter value is decreased to 0. The counter control signal generated by the numerically controlled oscillator NCO may be used to reset the counter value of the counter unit CU at the subsequent tick to a reset value. These subsequent ticks are indicated in the last line of FIG. 8 by arrows pointing upwards to the respective resetting ticks. In the example shown, the first reset value at the eighth tick of the last line in FIG. 8 is set to 9. After resetting the counter value the counter unit CU may start again with decreasing the counter value until the counter value reaches 0 again. In the example shown, the counter value is reset again by the NCO 84, this time to the value A. In other words, the counter unit CU may be configured to repeatedly count a variable predetermined number of ticks at the high rate. As one skilled in the art will recognize, there are many equally feasible ways of operating a counter unit, for example a counter unit with an incrementally rising counter value or similar counter techniques known in the art. The counter unit CU is not limited to the previously detailed illustrative method of operation.

There may be various distinct types of ticks during the operation of the counter unit CU. First, if the counter value reaches 0, the counter unit may generate a switch control signal which is fed to the sampling rate converter SRC. Assuming a sampling rate converter as described illustratively for FIG. 7, the switch control signal may be used to operate the controllable switch 77 in the sampling rate converter SRC such that one of the polyphase filters 76 is selectively coupled to an output terminal of the controllable switch 77. As shown in FIG. 8 the switch control signal may be timed such that the times when the controllable switch 77 is coupled to another one of the polyphase filters 76 essentially do not coincide with ticks of the low rate. If the controllable switch 77 is coupled to a different polyphase filter 76 at a time essentially coinciding with a tick of the low rate, it might be possible that the contents of the one of the polyphase filters 76 are read out before the digital control word can be updated in the polyphase filters 76. This might result in relaying an outdated digital control word from the polyphase filters 76 to the output terminal of the controllable switch 78. If the time span between a tick of the low rate and the timing of switching the controllable switch 77 is large enough, it may be ensured that the polyphase filters 76 are updated with the newest digital control word of the digital data signal DATA. Small variations of the tick frequency in the high rate may therefore be compensated for. Of course, if a different type of sampling rate converter SRC is used, the switch control signal may have to control the sampling rate converter SRC in an appropriate manner.

Second, if a tick of the low rate occurs, the counter unit CU may generate a signal representative of the counter value at the next tick of the high rate following directly after the tick of the low rate, i.e. at the position indicated in the third line of FIG. 8. This signal may be fed to the hold register 74 and passed on to the lookup table 73. The loop filter LF may receive a value of the lookup table 73 representative of the signal output by the counter unit CU and output a filtered signal to the adding unit 71. If for example the operational rate of the counter unit CU rises due to timing errors in the converting unit CONV or due to a higher desired oscillation frequency of a digitally controlled oscillator DCO, the ticks of the higher rate may occur more frequently with respect to the ticks of the low rate, which may occur at a constant rate. In this case the counter value at the respective first tick of the high rate after each tick of the low rate will decrease, since the counter unit CU decreases the counter value faster than originally expected. Then the signal representative of the counter value will indicate that the high rate tick speed has increased and the output of the loop filter LF may be used to adjust the input signal to the numerically controlled oscillator NCO. The numerically controlled oscillator NCO may then adjust the counter control signal. In particular, the numerically controlled oscillator NCO may adjust the counter control signal to increase the value to which the counter value is reset after the counter unit CU has decreased the counter value to 0. Therefore, in the next decrementing time span the initial counter value may be set higher and the counter unit CU may take longer to decrement the counter value to 0. On the other hand, if the operational rate of the counter unit CU decreases, the numerically controlled oscillator NCO may adjust the counter control signal to reset the counter value to a lower value than before. In other words, the counter unit CU may output an estimate on the long term deviations of the operational rate of the counter unit CU and the converting unit CONV from the expected operational rate, and via the feedback loop provided by the loop filter LF the numerically controlled oscillator NCO may adjust the counter reset value. If the counter reset value is adjusted that way, the timing of the switching of the controllable switch 77 is controlled such that the switching times of the controllable switch 77 will essentially not coincide with ticks of the low rate.

Additionally, the output of the loop filter LF may be used by the numerically controlled oscillator NCO to adjust the sampling rate of the sampling rate converter SRC. If the operational rate of the converting unit CONV increases, the operational rate of the counter unit CU increases. In this case the signal representative of the counter value at the next tick of the high rate following directly after the tick of the low rate will decrease. Via the feedback loop through the loop filter LF the numerically controlled oscillator NCO may then be able to increase the sampling rate of the sampling rate converter SRC such that there may be more interpolated values of the digital data signal DATA which may be fed to the converting unit operating at a higher operational rate.

It may be possible for the counter unit CU to determine the time span between a tick of the low rate and the subsequent next tick of the high rate. If the low rate and the high rate are incommensurate, this time span may be a fraction of the time span between two consecutive ticks of the high rate. That way it may be possible for the counter unit CU to determine timing errors at a temporal resolution higher than the temporal resolution given by the operational rate of the counter unit CU. The determined time span between a tick of the low rate and the subsequent next tick of the high rate may be used to further adjust the sampling rate of the sampling rate converter SRC and to further adjust the counter control signal generated by the numerically controlled oscillator NCO. It may be possible to determine this time span by using a time-to-digital converter similar to the time-to-digital converter TDC in FIG. 6.

FIG. 9 shows an illustrative embodiment of a method. In a first step, an oscillator control signal is generated at a first rate. In a second step, the generated oscillator control signal is fed to a digitally controlled oscillator at a second rate. In a third step, a counter unit is operated at an oscillation rate of the digitally controlled oscillator, which oscillation rate may be derived from information included in the oscillator control signal. The counter unit may in particular be a decremental or an incremental integer counter, although any other known counter unit may be used as well. In a fourth step, counter values of the counter unit are determined at the first rate. The determined counter values are used in a fifth step to adjust the second rate.

FIG. 10 schematically illustrates a device 1000 as an illustrative embodiment. The device 1000 is similar to the device 200 in that it may have a control unit CTRL, an interpolating device IP and a digitally controlled oscillator DCO similar to the respective ones in the device 200. Additionally, the device 1000 may have a phase locked loop circuit similar to the phase locked loop circuit of device 600 having a multi modulus divider MMD, a sigma delta converter ΣΔ, a time-to-digital converter TDC and a low pass loop filter LFLO.

FIG. 11 schematically illustrates a device as an illustrative embodiment. The device illustrates the control unit CTRL of FIG. 2 in greater detail. The control unit CTRL may have an adding unit 41, a channel frequency input CH, a multiplier 40 and a numerically controlled oscillator NCO similar to the respective ones detailed in FIGS. 4 and 5.

It should be noted that the embodiment of FIG. 7 may be combined with any of the embodiments shown in FIGS. 1 to 6 and 10, 11 without departing from the spirit and the scope of the invention.

Further, it is to be noted that it is possible to obtain timing error information by using other implementations of timing error detectors than the timing error detector implementation relying on a counter CU as shown in FIG. 7. For instance, the timing error detectors TED and TED2 used in the embodiments described above may include time-to-digital (TDC) converters. The time-to-digital converter (TDC) may be used to directly measure the timing of the oscillation frequency of the digitally controlled oscillator, e.g. the time intervals between the high rate ticks as depicted in line 2 of FIG. 8. This timing information, which may also be measured at a resolution higher than the time intervals between consecutive high rate ticks, may be directly compared to timing information indicative of the desired oscillation frequency. Based on that comparison, the timing error information may be derived. Still another possibility to obtain timing error information is to use time error detectors TED and TED2 configured to detect zero crossings between two consecutive symbols in the data path upstream of the converting unit CONV, in particular of the digitally controlled oscillator DCO. This timing information may only be obtained at the low rate. By way of example, the timing information in the radial digital data signal DATAR may be evaluated by timing error detector TED2. One skilled in the art will recognize that it may be possible to combine any of the detailed methods of determining timing deviations of the output signal of the converting unit CONV.

FIG. 12 illustrates an illustrative timing diagram as part of the illustrative timing diagram shown in FIG. 8. What is shown are ticks 121 occurring at a low rate and ticks 122 occurring at a high rate. In this example, for every three ticks 121 of the low rate, 32 ticks 122 of the high rate occur. These numbers are merely an example and any other ratio of ticks may be provided. The low rate may be the sample rate of a digital data signal similar to the digital data signals DATA, DATAF and DATAR in FIGS. 1 to 7 and may in particular be the same rate as the low rate shown in FIG. 8. The high rate may be the sample rate of a digitally controlled oscillator DCO and may in particular be the same rate as the high rate shown in FIG. 8.

For 32 ticks 122 of the high rate to occur during the occurrence of three ticks 121 of the low rate, 32/3 ticks 122 have to occur between two ticks 121 of the low rate. There may be two values associated with this number—the integer valued full tick count 123 at the high rate and the fractional remainder 124 between the last tick of the high rate and a subsequent tick of the low rate. In the example shown, the full tick count 123 is given as 10 and the fractional tick count 124 is given 2/3. The full tick count 123 may be assigned to a variable lfsrCycl, the fractional tick count 124 may be assigned to a variable Offset. For the subsequent period between two ticks of the low rate, the variables lfsrCycl and Offset would change to 11 and 1/3, respectively, since there are 11 full ticks occurring in that time period and the fraction of a tick period in the high rate between the 11$^{th}$ tick of the high rate and the following tick of the low rate is 1/3.

FIG. 13 schematically illustrates a device according to an illustrative embodiment. FIG. 13 shows an illustrative embodiment of a numerically controlled oscillator NCO. The numerically controlled oscillator NCO may be used as an illustrative embodiment for the numerically controlled oscillators NCO shown in the FIGS. 4 to 7 and FIG. 11. The numerically controlled oscillator NCO may have an input 131 configured to receive an input signal Data, a first output 132 configured to output a first output signal lfsrCycl and a second output 133 configured to output a second output signal Offset. The signals lfsrCycl and Offset may in particular be the variables lfsrCycl and Offset as described in FIG. 12. The input signal Data may in particular be a scaled digital data signal including an oscillator control signal for a digitally controlled oscillator DCO.

The signal lfsrCycl may be coupled to an input 81 of a counter unit CU, possibly via a lookup table 85 and a hold register 84 as shown in FIG. 7. The signal lfsrCycl may in particular be used for determining the counter value of the counter unit CU to which the counter unit CU should be reset when the counter unit CU has finished a counting cycle. These counter values may be stored in the lookup table 85 and may be read out in response to the signal lfsrCycl. The signal Offset may be coupled to a control input 14 of a sampling unit such as e.g. an interpolator IP or sampling rate converter SRC as shown in FIGS. 4 to 7 and FIGS. 10 and 11. The signal Offset may in particular be used to determine filter coefficients of the interpolator IP.

FIG. 14 schematically illustrates an illustrative embodiment of the device of FIG. 13 in more detail. The device shown in FIG. 14 represents a more detailed implementation of the device shown in FIG. 13 and may be a NCO. The NCO includes a first input 131, a first output 132 and a second output 133, wherein the first input 131 is connected to a third adder 145. The third adder 145 is connected to a first (upper) signal path, a second (middle) signal path and a third (lower) signal path.

The first signal path includes a first adder 146, a first discarding unit 147, a first register 148a and a NOT gate 149 arranged in series. The first register 148a and the first adder 146 are connected by a feedback loop 150. The output of the NOT gate 149 is connected to the first output 132. The second signal path includes a second discarding unit 151 and a comparison unit 152 arranged in series. The comparison unit 152 is connected to the first signal path at a contact arranged between the first discarding unit 147 and the first register 148a. The third signal path includes a third discarding unit 153, a second adder 154 and a switch 155. The switch 155 includes two switch positions selectively connecting the second output 133 via a second register 148b to the third discarding unit 153 or the second adder 154. Moreover, the switch 155 is connected to the comparison unit 152. The NCO further includes a second input 141 connected to the third adder 145. The second register 148b may be used to synchronize the outputs of the NCO available at the second output 133 and the first output 132.

In the following, an operating mode of the NCO will be explained using the timing diagram of FIG. 15. The first time interval between the first two ticks 121 corresponds to a first operation cycle of the NCO. A ratio of a low frequency clock at the low rate and a high frequency clock at the high rate is input into the first input 131 of the NCO. A data word representing this ratio may, for example, be represented by 29 (particularly unsigned) bits, wherein the six most significant bits (MSB) represent an integer portion of the ratio and the remaining 23 least significant bits (LSB) represent a decimal portion of the ratio. For the case of the timing diagram in FIG. 15, the ratio might have a value of 16/3. Accordingly, the six MSB represent an integer portion of five and the 23 LSB represent a decimal portion of 1/3.

The ratio of the low frequency clock and the high frequency clock may be corrected by a correction value provided by the second input 141. The correction value is added to the ratio via the third adder 145. Such a correction may be helpful for the case of unstable frequency clocks that may occur for the case of unstable oscillators generating the frequency clocks. In the following, the correction value is supposed to be zero.

The fractional value of 16/3 is forwarded to the first adder 146. Since the first register 148a is set to a value of zero for the first operation cycle of the NCO, the feedback loop 150 provides a value of zero to the first adder 146. The first discarding unit 147 thus receives a value of 16/3 and discards, i.e. deletes, the six MSB representing the integer portion of 16/3, i.e. a value of five. The remaining 23 LSB representing a value of 1/3 are forwarded to the first register 148a. The NOT gate 149 receives the value of 1/3 and subtracts this value from a value of one leading to a value of 2/3 forwarded to the first output 132. The described subtraction corresponds to inverting the 23 LSB and may thus also be referred to as an inversion.

Still referring to the first operation cycle of the NCO, the second discarding unit 151 in the second signal path discards the six MSB and forwards the remaining 23 LSB representing a value of 1/3 to the comparison unit 152. In the lower signal path, the third discarding unit 153 discards the 23 LSB (i.e. a decimal portion of 1/3) and outputs the remaining six MSB representing a value of five. For the first operation cycle, the switch 155 is set to a default first switch position connecting the second output 133 to the output of the third discarding unit 153 via the second register 148b.

The comparison unit 152 compares a value x received from the first discarding unit 147 and a value y received from the second discarding unit 151. If the value x is smaller than the value y, the comparison unit 152 controls the switch 155 in such a way that the switch 155 changes from the first switch position to a second switch position connecting the second output 133 to the second adder 154. If the switch 155 is in the second switch position, the second adder 154 adds a value of one to the value output by the third discarding unit 153. In the first operation cycle, the values x and y both equal 1/3 and thus the switch 155 does not change from the first to the second switch position. Since no value of one is added by the second adder 154 during the first operation cycle, the second output 133 outputs a value of five.

In accordance with the timing diagram shown in FIG. 15, the second output 133 outputs a value of 2/3 corresponding to the first time offset 124 and the second output 133 outputs a value of five corresponding to the number of clock pulses of the high frequency clock occurring during the first time interval between the first two ticks 121 of the low rate.

In the following, the second and third operation cycles of the NCO in FIG. 14 will be explained. Here, the second operation cycle corresponds to the second time interval in the low rate following the first time interval and the third operation cycle corresponds to the third time interval following the second time interval. For a better understanding, the following Table 1 includes values at different locations in the NCO during its different operation cycles.

TABLE 1

| Cycle No. | a | b | c | Offset | n |
|---|---|---|---|---|---|
| 1 | 16/3 | 1/3 | 5 | 2/3 | 5 |
| 2 | 16/3 | 2/3 | 5 | 1/3 | 5 |
| 3 | 16/3 | 0 | 5 | 1 | 6 |

In Table 1, the parameter a denotes the value input to the first input 131, the parameter b denotes the value output by the first discarding unit 147, the parameter c denotes the value output by the third discarding unit 153, the value Offset denotes the time offset output by the second output 133 and the parameter n denotes the number of high frequency clock pulses occurring at the high rate during the regarded time interval output by the second output 133. The parameter n may be output as the output signal lfsrCycl.

For the first operation cycle, the table values have already been derived: a=16/3, b=1/3, c=5, OFFSET=2/3 and n=5. Referring now to the second operation cycle, the ratio of the low frequency clock and the high frequency clock remains the same, i.e. a=16/3. The first adder 146 adds a value of 16/3 and a value of 1/3 (provided by the feedback loop 150) leading to a value of 17/3, the integer portion of which is discarded by the first discarding unit 147. Therefore, b equals a value of 2/3. Note that the addition performed by the first adder 146 may lead to an additional MSB required for a proper representation of the integer portion of the ratio. An inversion performed by the NOT gate 149 leads to a time offset value Offset of 1/3 for the second operation cycle output by the first output 132.

Due to discarding the decimal portion of the input ratio 16/3, the third discarding unit 153 outputs a value c of five. Since x equals 2/3 and y equals 1/3, the switch 155 does not change to the second switch position connecting the second output 133 to the second adder 154. Accordingly, the second adder 154 does not add a value of one and the second output 133 outputs a value of five.

Referring now to the third operation cycle, the ratio input at the first input 131 still remains the same, i.e. a=16/3. The first adder 145 adds a value of 16/3 and a value of 2/3 (provided by the feedback loop 150) leading to a value of 18/3, whose integer portion of six is discarded by the first discarding unit 147. Therefore, b equals zero and the NOT gate 149 forwards a time offset Offset of one to the first output 132.

Due to discarding the decimal portion of the input ratio 16/3, the third discarding unit 153 again outputs a value c of five. Since x now equals zero and y equals 1/3, the switch 155 changes from the first switch position to the second switch position connecting the second output 133 to the second adder 154. Accordingly, the second adder 154 adds a value of one to the value c and the second output 133 outputs a value of six.

As can be seen in the description of FIG. 15, later time intervals may be obtained by simply repeating the first three time intervals. For example, a fourth time interval would then correspond to the first time interval, a fifth time interval would correspond to the second time interval, etc. In this connection, it is to be noted that the first register 148a may be reset to a value of zero after the third time interval has passed. For the sake of simplicity, a unit to reset the first register 148a to a specific value is not explicitly illustrated in FIG. 14.

FIG. 15 schematically illustrates an illustrative timing diagram. Ticks 121 are occurring at a low rate and ticks 122 are occurring at a high rate. The offset values 124 represent relative distances in terms of a time interval between two consecutive ticks 122 at the high rate and thus have values greater than or equal to zero and smaller than one. The relative distances are measured between the last two ticks 122 occurring at the high rate before a tick 121 at the low rate is occurring. Furthermore, the number of ticks 122 at the high rate between two consecutive occurrences of ticks 121 at the low rate is counted in integer values.

In the embodiments as described above, an oscillation may be provided by a digitally controlled oscillator (DCO) wherein the frequency of the provided oscillation may be controlled by a digital signal input to the digitally controlled oscillator. In the following, illustrative embodiments are described in which the frequency of an oscillation is controlled by a digital-to-time converter (DTC) and its input. The described exemplary embodiments are based on and represent modifications of the device 200 of FIG. 2. However, it is understood that any of the other previously described devices including a digitally controlled oscillator also may be modified in a similar manner. In this regard, it is further understood that each of the figures described above may be modified by replacing the functional block DCO by a functional block DTC.

FIG. 16 schematically illustrates a device 1600 as an illustrative embodiment including a control unit CTRL, an interpolating device IP and a digital-to-time converter DTC. Note that the device 1600 is similar to the device 200 of FIG. 2 wherein the digitally controlled oscillator DCO of FIG. 2 is replaced by the digital-to-time converter DTC. Disclosure made in connection with FIG. 2 may thus also hold true in connection with the device 1600. It is understood that replacing the digitally controlled oscillator DCO by the digital-to-time converter DTC may require further modifications which will become apparent by the following disclosure.

During an operation of the device 1600, a digital data signal DATA is input to the control unit CTRL and the interpolating unit IP wherein the digital data signal DATA may include information about a desired phase to be delayed by the digital-to-time converter DTC. For example, the digital data signal DATA may correspond to a phase signal having a value lying in an interval $[-\pi,\pi]$. The control unit CTRL differentiates the digital data signal DATA with respect to time such that a frequency is obtained. Based on the obtained frequency and information on a channel frequency CH, the control unit CTRL may obtain a digital control signal which is forwarded to the interpolating device IP. An interpolation rate of the interpolating device IP may be varied according to the forwarded digital control signal as has already been described in connection with FIG. 2. The digital data signal DATA input to the interpolating device IP is interpolated on the basis of the interpolation rate and the interpolated digital signal is input to the digital-to-time converter DTC. Note that the interpolating device IP may be configured to interpolate a wrapped phase signal, i.e. a phase signal constrained to a certain phase interval, e.g. $[-\pi,\pi]$.

The interpolated digital signal input to the digital-to-time converter DTC may correspond to a phase signal and/or may at least include information on a phase. Based on this information, the digital-to-time converter DTC may delay a reference oscillation provided by an arbitrary unit, for example by a digitally controlled oscillator. For example, the digital-to-time converter DTC may delay a predetermined phase of the reference oscillation for the duration of a predetermined time interval. It is thus possible to control a frequency of a reference oscillation by means of the digital-to-time converter DTC and its input signal. This way, an oscillation may be provided similar to the oscillation output by the digitally controlled oscillator DCO of FIG. 2.

FIG. 17 schematically illustrates a device 1700 as a further illustrative embodiment. The device 1700 is similar to the device 1600 of FIG. 16 and additionally includes a unit DIFF configured to differentiate an input signal with respect to time and a unit INT configured to integrate an input signal with respect to time. Disclosure made in connection with FIG. 16 may also hold true in connection with the device 1700.

Similar to FIG. 16, the digital input signal DATA may correspond to a phase signal which may be differentiated by the unit DIFF with respect to time such that a frequency is obtained. On the basis of the obtained frequency and a channel frequency CH, the control unit CTRL obtains a digital control signal including information on an interpolation rate which is input to the interpolating device IP. The obtained frequency is also input to the interpolating device IP and interpolated on the basis of the interpolation rate. The interpolated signal is integrated with respect to time by the unit INT such that an obtained phase signal may be further processed by the digital-to-time converter DTC, as has already been described in connection with FIG. 16.

FIG. 18 schematically illustrates a device 1800 as a further illustrative embodiment. The device 1800 is similar to the device 1700 of FIG. 17 wherein the units INT and DIFF are interchanged. Disclosure made in connection with FIG. 17 may also hold true for the device 1800. In FIG. 18, the control unit CTRL is configured to obtain a frequency on the basis of the integrated signal, for example by differentiating the integrated signal twice with respect to time. On the basis of the obtained frequency and the channel information CH, an interpolation rate may be calculated and input to the interpolating device IP. Similar to FIG. 17, a phase signal is input to the digital-to-time converter DTC.

FIG. 19 schematically illustrates a device 1900 as a further illustrative embodiment. The device 1900 is similar to the device 1600 of FIG. 16 and additionally includes a unit f(DATA) configured to process a signal on the basis of an arbitrary function or operator f. For example, the unit f(DATA) may be configured to differentiate a signal with respect to time (see e.g. unit DIFF of FIG. 17) or may be configured to integrate a signal with respect to time (see e.g. unit INT of FIG. 17). In addition, the device 1900 includes a unit $f^{-1}$ (DATA) configured to process a signal on the basis of an inverse of the function f. Note that the input signal DATA may again correspond to a phase signal on the basis of which the control unit CTRL may obtain a frequency. Since the unit $f^{-1}$ (DATA) performs an inverse of the function f, the signal input to the digital-to-time converter DTC corresponds to a phase signal if the digital data signal DATA does.

FIG. 20 schematically illustrates a device 2000 as a further illustrative embodiment. The device 2000 is similar to the device 1900 wherein the digital-to-time converter DTC of FIG. 19 has been replaced by a digitally controlled oscillator DCO. The device 2000 thus may correspond to the device 200 of FIG. 2, wherein an additional unit f(DATA) is arranged upstream of the interpolating device IP and an additional unit $f^{-1}$ (DATA) is arranged downstream of the interpolating device IP. Example embodiments of the units f(DATA) and $f^{-1}$ (DATA) have already been described in connection with FIG. 19.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Numerous other embodiments, modifications and variations within the scope and spirit of the appended claims will occur to persons of ordinary skill in the art from a review of this disclosure.

The invention claimed is:

1. A device, comprising:
a digital-to-time converter;
a first interpolator having a data input and a data output coupled to the digital-to-time converter, the first interpolator configured to receive a converter control signal at the data input, and configured to provide an interpolated converter control signal at the data output; and
a control unit having a first input, a second input and an output, the control unit configured to:
receive a channel control signal at the first input,
receive a signal depending on the converter control signal at the second input, and
provide an interpolator control signal at the output, the output coupled to a control input of the first interpolator,
wherein an interpolation rate of the first interpolator depends on the converter control signal.

2. The device of claim 1, wherein the control unit further comprising:
an adding unit having a first input coupled to the first input of the control unit, and a second input coupled to the second input of the control unit; and
a numerically controlled oscillator having an input coupled to an output of the adding unit, and an output coupled to the control input of the first interpolator.

3. The device of claim 2, further comprising:
a timing correction unit coupled to the digital-to-time converter, the timing correction unit having an output coupled to at least one of a third input of the adding unit and the data input of the first interpolator.

4. The device of claim 3, wherein the timing correction unit further comprising:
a timing error detector having an input coupled to the digital-to-time converter.

5. The device of claim 4, wherein the timing correction unit further comprising:
a loop filter having an input coupled to an output of the timing error detector, and an output coupled to the at least one of the third input of the adding unit and the data input of the first interpolator.

6. The device of claim 4, wherein the timing error detector comprises a counter coupled to the digital-to-time converter.

7. The device of claim 4, wherein the timing error detector comprises a time-to-digital converter coupled to the digital-to-time converter.

8. The device of claim 1, further comprising:
a digital-to-analog converter; and a second interpolator having an input configured to receive a digital-to-analog converter input, wherein the second interpolator is configured to feed an interpolated digital-to-analog converter input signal to the digital-to-analog converter, and wherein an interpolation rate of the second interpolator depends on at least one of the converter control signal and the digital-to-analog converter input signal.

9. The device of claim 8, further comprising:
a control unit having a first input configured to receive a channel control signal;
a second input configured to receive a signal depending on the converter control signal; and
an output, wherein the control unit is configured to provide an interpolator control signal at the output, wherein the output is coupled to a control input of the interpolator, and wherein the control unit is configured to control the interpolation rate of the second interpolator.

10. The device of claim 1, wherein the digital-to-time converter is coupled to a unit that is configured to provide a reference oscillation signal.

11. The device of claim 10, wherein the digital-to-time converter is configured to control a frequency value of the reference oscillation signal.

12. The device of claim 10, wherein the unit that is configured to provide the reference oscillation signal comprises a digitally controlled oscillator.

13. The device of claim 1, further comprising:
a first unit configured to process a signal on the basis of a predetermined function so as to generate the converter control signal; and a second unit configured to process the interpolated converter control signal on the basis of an inverse of the predetermined function.

14. A device, comprising:
a digital-to-time converter having a control input;
a sampling unit coupled to the control input of the digital-to-time converter;
a timing error detector coupled to an output of the digital-to-time converter; wherein a sampling rate of the sampling unit depends on an output of the timing error detector,
an adding unit having a first input configured to receive a channel control signal; and
a numerically controlled oscillator having an input coupled to an output of the adding unit and configured to control the sampling rate of the sampling unit.

15. The device of claim 14, further comprising:
a loop filter having an input coupled to the output of the timing error detector, and an output coupled to at least one of a second input of the adding unit and an input of the sampling unit.

16. The device of claim 14, wherein the timing error detector comprises a counter coupled to the digital-to-time converter.

17. The device of claim 14, wherein the timing error detector comprises a time-to-digital converter coupled to the digital-to-time converter.

18. The device of claim 14, wherein the sampling unit comprises: a sampling rate converter configured to interpolate a converter control signal at an interpolation rate depending on an output signal of the digital-to-time converter.

19. A device, comprising:
a digital-to-time converter;
a first interpolator having a data input and a data output coupled to the digital-to-time converter, wherein the first interpolator is configured to receive a converter control signal at the data input, and configured to provide an interpolated converter control signal at the data output;
a first unit configured to process a signal on the basis of a predetermined function so as to generate the converter control signal; and a second unit configured to process the interpolated converter control signal on the basis of an inverse of the predetermined function,
wherein an interpolation rate of the first interpolator depends on the converter control signal.

* * * * *